United States Patent
Kuo et al.

(10) Patent No.: US 11,428,870 B2
(45) Date of Patent: Aug. 30, 2022

(54) SEMICONDUCTOR STRUCTURE AND METHOD OF FABRICATING THE SAME

(71) Applicant: Taiwan Semiconductor Manufacturing Co., Ltd., Hsinchu (TW)

(72) Inventors: Feng-Wei Kuo, Hsinchu County (TW); Wen-Shiang Liao, Miaoli County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/901,010

(22) Filed: Jun. 15, 2020

(65) Prior Publication Data

US 2021/0389526 A1 Dec. 16, 2021

(51) Int. Cl.
*G02B 6/34* (2006.01)
*G02B 6/124* (2006.01)
*G02B 6/13* (2006.01)
*H01L 21/02* (2006.01)

(52) U.S. Cl.
CPC .............. *G02B 6/34* (2013.01); *G02B 6/124* (2013.01); *G02B 6/13* (2013.01); *H01L 21/02* (2013.01)

(58) Field of Classification Search
CPC . G02B 6/30; G02B 6/34; G02B 6/124; G02B 6/1347; H01L 21/02
USPC .......................................................... 385/37
See application file for complete search history.

(56) References Cited

U.S. PATENT DOCUMENTS

2015/0260913 A1\* 9/2015 Li ...................... G02B 6/4296
385/14

\* cited by examiner

*Primary Examiner* — Michael P Mooney
(74) *Attorney, Agent, or Firm* — JCIPRNET

(57) ABSTRACT

A semiconductor structure including a semiconductor substrate, a first patterned dielectric layer, a grating coupler and a waveguide is provided. The semiconductor substrate includes an optical reflective layer. The first patterned dielectric layer is disposed on the semiconductor substrate and covers a portion of the optical reflective layer. The grating coupler and the waveguide are disposed on the first patterned dielectric layer, wherein the grating coupler and the waveguide are located over the optical reflective layer.

20 Claims, 11 Drawing Sheets

SEMICONDUCTOR STRUCTURE AND METHOD OF FABRICATING THE SAME

BACKGROUND

Silicon photonic technologies are emerging as important roles for high-speed optical data communication. For instance, optical transceiver modules including high-speed phase modulators, grating couplers and waveguides are used in high-speed optical communication systems. The optical transceiver modules comply with various international standard specifications at communication speeds ranging up to more than 100 Gbps. The performance of the optical transceiver modules is determined by coupling efficiency of the grating couplers in the optical transceiver modules. Improvement of coupling efficiency of the grating couplers is required in this field.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
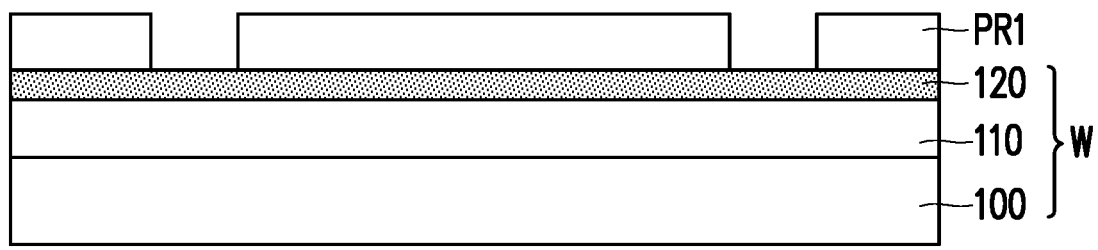
FIG. 1 through FIG. 7 are cross-sectional views schematically illustrating a process flow for fabricating an upper portion of a semiconductor structure in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 through FIG. 7 are cross-sectional views schematically illustrating a process flow for fabricating an upper portion of a semiconductor structure in accordance with some embodiments of the present disclosure.

Referring to FIG. 1, a semiconductor wafer W including a semiconductor substrate 100, a dielectric material layer 110 disposed on the semiconductor substrate 100 and a semiconductor layer 120 disposed on the dielectric material layer 110 is provided. The semiconductor wafer W may be a Silicon-On-Insulator (SOI) wafer including a silicon substrate 100, a silicon dioxide ($SiO_2$) layer 110 disposed on the silicon substrate 100 and a doped silicon layer 120 disposed on the silicon dioxide layer 110. The dielectric material layer 110 may entirely cover the top surface of the semiconductor substrate 100. The semiconductor layer 120 may entirely cover the top surface of the dielectric material layer 110. The thickness of the semiconductor substrate 100 may range from about 50 micrometers to about 760 micrometers, the thickness of the dielectric material layer 110 may range from about 0.5 micrometers to about 5 micrometers, and the thickness of the semiconductor layer 120 may range from about 100 nanometers to about 5000 nanometers. For example, the thickness of the semiconductor substrate 100 is about 100 micrometers, the thickness of the dielectric material layer 110 is about 2 micrometers, and the thickness of the semiconductor layer 120 is about 270 nanometers.

A patterned photoresist layer PR1 is formed over the semiconductor wafer W to cover portions of the semiconductor layer 120. The semiconductor layer 120 may include photonic regions covered by the patterned photoresist layer PR1. In some embodiments, the semiconductor layer 120 further includes electric device regions for forming semiconductor devices (not shown), such as metal-oxide-semiconductor field effect transistors (MOSFETs), capacitors, inductors, resistors and so on. The patterned photoresist layer PR1 may be formed on the semiconductor layer 120 through a lithography process, and the lithography process may include spin coating of photoresist material, baking of the photoresist material, exposure of the baked photoresist material and development of the exposed photoresist material.

Figure 2:
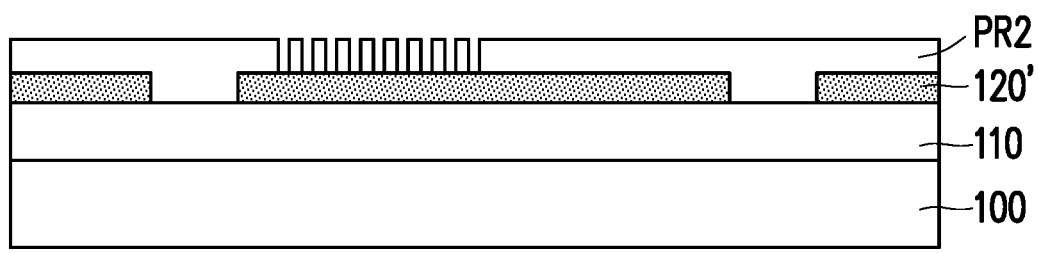

Referring to FIG. 1 and FIG. 2, a patterning process is performed to remove portions of the semiconductor layer 120 which are uncovered by the patterned photoresist layer PR1 such that semiconductor patterns 120' are formed over the dielectric material layer 110. The above-mentioned patterning process of the semiconductor layer 120 may be an etching process for removing the portions of the semiconductor layer 120 which are uncovered by the patterned photoresist layer PR1 until portions of the dielectric material layer 110 are revealed. After performing the patterning process, the patterned photoresist layer PR1 is removed from the semiconductor patterns 120'.

A patterned photoresist layer PR2 is formed to cover the semiconductor patterns 120' and the dielectric material layer 110. The patterned photoresist layer PR2 may be formed on the semiconductor patterns 120' and the dielectric material layer 110 through a lithography process, and the lithography process may include spin coating of photoresist material, baking of the photoresist material, exposure of the baked photoresist material and development of the exposed photoresist material. The patterned photoresist layer PR2 may include slit patterns for defining grating couplers in the semiconductor patterns 120'. The slit patterns defined in the patterned photoresist layer PR2 may be a series of arc-shaped slit patterns when viewing from atop. Furthermore, the shape, position and/or dimension of the grating couplers to be formed in the semiconductor patterns 120' may be determined by the slits defined in the patterned photoresist layer PR2.

Figure 3:
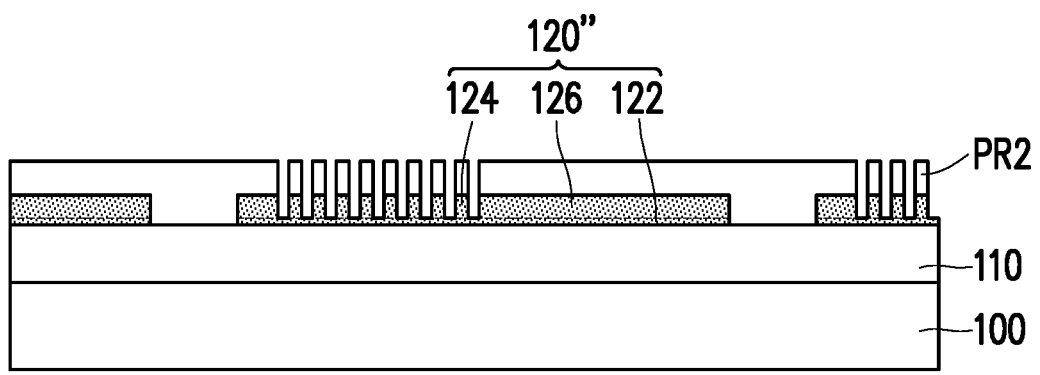

Referring to FIG. 2 and FIG. 3, a removal process is performed to remove portions of the semiconductor patterns 120' which are uncovered by the patterned photoresist layer PR2 such that semiconductor patterns 120' including grating couplers 124 and waveguides 126 are formed over a top surface of the dielectric material layer 110. The above-mentioned removal process may include an etching process for removing portions of the semiconductor patterns 120' which are uncovered by the patterned photoresist layer PR2. The etching depth of the removal process may be less than the thickness of the semiconductor patterns 120'. The etching depth of the removal process may be about 100 nanometers to about 10000 nanometers. For example, the etching depth of the removal process is about 140 nanometers. In some alternative embodiments, the above-mentioned removal process may include multiple etching processes.

Figure 19:
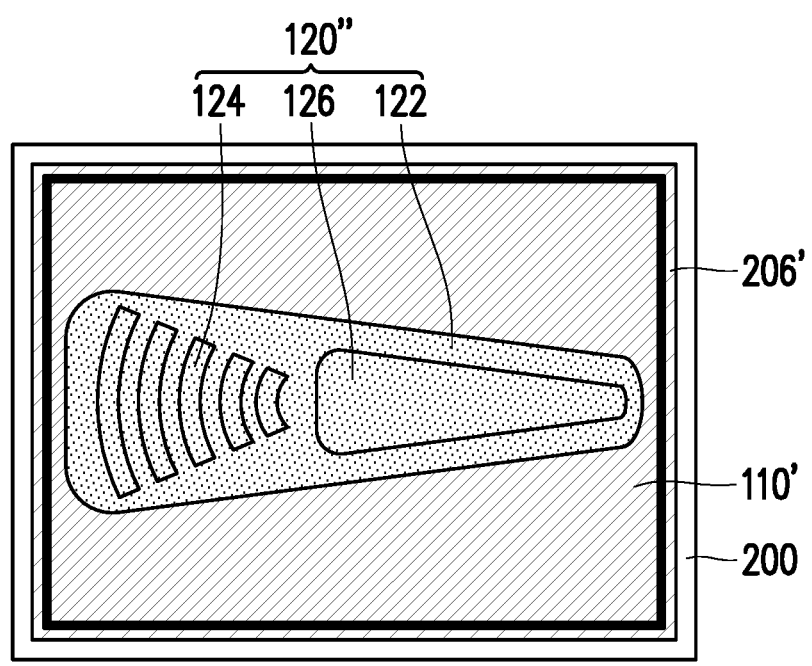
FIG. 19 is a top view of the semiconductor structure in accordance with some embodiments of the present disclosure.

After performing the above-mentioned removal process, each of the semiconductor patterns 120" may include a base portion 122 disposed on the dielectric material layer 110, a grating coupler 124 disposed on the base portion 122 and a waveguide 126 disposed on the base portion 122, wherein the grating coupler 122 and the waveguide 126 landed on the same base portion 122 may be separated from each other. For example, as illustrated in FIG. 19, in each semiconductor patter 120", a series of arc-shaped grating couplers 124 and a tapering shaped waveguide 126 are formed over a tapering shaped base portion 122. Furthermore, the series of arc-shaped grating couplers 124 may be apodized grating couplers.

Figure 4:
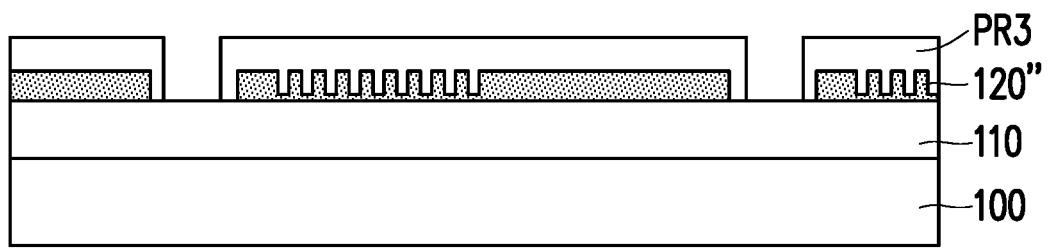

Referring to FIG. 3 and FIG. 4, after performing the removal process, the patterned photoresist layer PR2 is removed from the semiconductor patterns 120' and the dielectric material layer 110. A patterned photoresist layer PR3 may be then formed to cover the semiconductor patterns 120" and portions of the dielectric material layer 110. The patterned photoresist layer PR3 may be formed on the semiconductor patterns 120" and portions of the dielectric material layer 110 through a lithography process, and the lithography process may include spin coating of photoresist material, baking of the photoresist material, exposure of the baked photoresist material and development of the exposed photoresist material. In some embodiments, the semiconductor patterns 120" are entirely covered and well protected by the patterned photoresist layer PR3.

Figure 5:
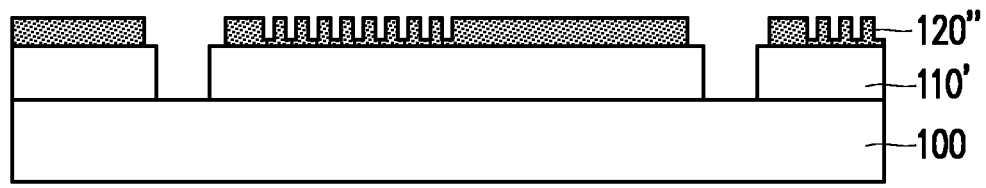

Referring to FIG. 4 and FIG. 5, a patterning process is performed to remove portions of the dielectric material layer 110 which are uncovered by the patterned photoresist layer PR3 such that a bottom dielectric layer 110' having a predetermined pattern is formed over the semiconductor substrate 100. The above-mentioned patterning process of the dielectric material layer 110 may be an etching process for removing the portions of the of the dielectric material layer 110 which are uncovered by the patterned photoresist layer PR3 until portions of the semiconductor substrate 100 are revealed. After performing the patterning process, the patterned photoresist layer PR3 is removed from the semiconductor patterns 120" and the bottom dielectric layer 110'. In some other embodiments, the patterning process for removing portions of the dielectric material layer 110 is omitted.

Figure 6:
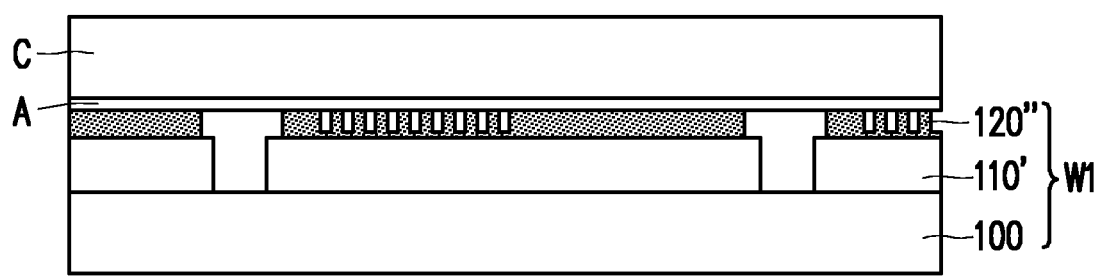

Referring to FIG. 6, a carrier C is provided. An adhesive layer A is formed over the carrier C. The carrier C may a wafer form glass carrier, and the adhesive layer A may be a Light Transfer Heat Conversion (LTHC) layer adhered with a surface of the carrier C. The semiconductor wafer W1 including the semiconductor substrate 100, the bottom dielectric layer 110' and the semiconductor patterns 120" is temporarily bonded with the carrier C through the adhesive layer A. After the semiconductor wafer W1 is temporarily bonded with the carrier C, the semiconductor patterns 120" are in contact with and adhered with the adhesive layer A. In other words, the carrier C and the semiconductor wafer W1 are located at opposite sides of the adhesive layer A, respectively.

Figure 7:
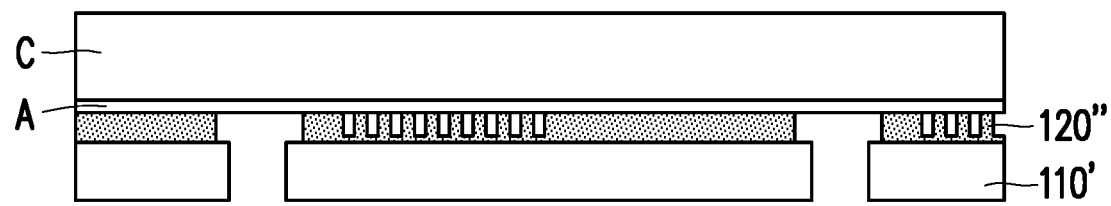

Referring to FIG. 6 and FIG. 7, after the semiconductor wafer W1 is temporarily bonded with the carrier C through the adhesive layer A, the semiconductor substrate 100 is removed from the bottom dielectric layer 110' such that an upper portion of a semiconductor structure is temporarily carried by the carrier C, and a bottom surface of the bottom dielectric layer 110' is revealed. The upper portion of a semiconductor structure may include the bottom dielectric layer 110' and the semiconductor patterns 120" disposed over the bottom dielectric layer 110'. The upper portion of a semiconductor structure may be a photonic die including the bottom dielectric layer 110' and the semiconductor patterns 120". In some embodiments, the semiconductor substrate 100 is removed from the bottom dielectric layer 110' through a laser lift-off process. In some other embodiments, the semiconductor substrate 100 is removed from the bottom dielectric layer 110' through a backside etching process. In some alternative embodiments, the semiconductor substrate 100 is removed from the bottom dielectric layer 110' through a grinding process. Furthermore, the grinding process may include a mechanical grinding process, a chemical mechanical polishing (CMP) process or combinations thereof.

FIG. 8 through FIG. 11 are cross-sectional views schematically illustrating a process flow for fabricating a lower portion of a semiconductor structure in accordance with some other embodiments of the present disclosure.

Figure 8:
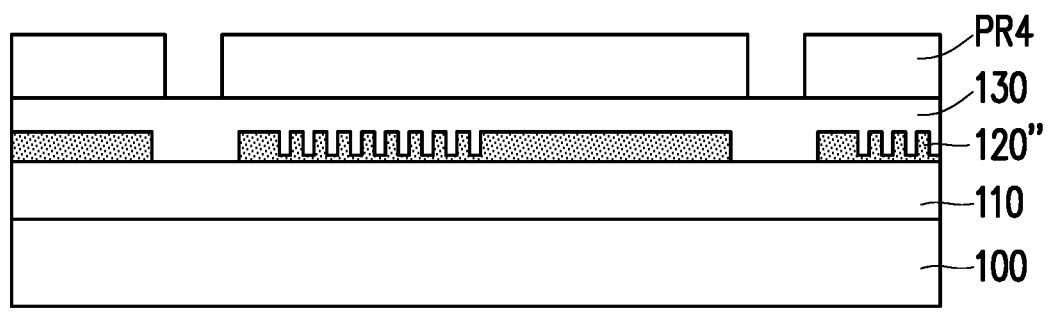
FIG. 8 through FIG. 11 are cross-sectional views schematically illustrating a process flow for fabricating a lower portion of a semiconductor structure in accordance with some other embodiments of the present disclosure.

Referring to FIG. 3 and FIG. 8, after performing the removal process, the patterned photoresist layer PR2 is removed from the semiconductor patterns 120' and the dielectric material layer 110. A dielectric material layer 130 is formed to cover the semiconductor patterns 120' and the dielectric material layer 110. The material of the dielectric material layer 130 may be the same as that of the dielectric material layer 110. For example, the material of the dielectric material layer 110 and the dielectric material layer 130 includes silicon dioxide ($SiO_2$). The thickness of the dielectric material layer 130 may be the same as that of the dielectric material layer 110. The thickness of the dielectric material layer 130 may range from about 0.01 micrometers to about 10 micrometers. For example, the thickness of the dielectric material layer 130 is about 2 micrometers.

A patterned photoresist layer PR4 may be then formed to cover the dielectric material layer 130. The patterned photoresist layer PR4 may be formed on the dielectric material layer 130 through a lithography process, and the lithography process may include spin coating of photoresist material, baking of the photoresist material, exposure of the baked photoresist material and development of the exposed photoresist material. In some embodiments, the semiconductor patterns 120" are entirely covered and well protected by the dielectric material layer 130 and the patterned photoresist layer PR4.

Figure 9:
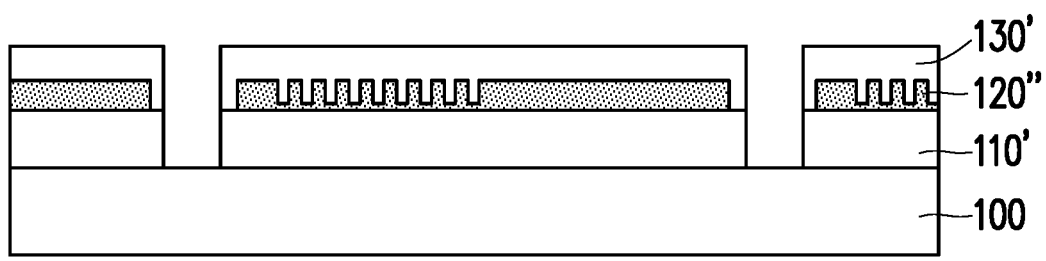

Referring to FIG. 8 and FIG. 9, a patterning process is performed to remove portions of the dielectric material layer 130 and the dielectric material layer 110 which are uncovered by the patterned photoresist layer PR4 such that a bottom dielectric layer 110' having a predetermined pattern and a top dielectric layer 130' having a predetermined pattern are formed over the semiconductor substrate 100. The above-mentioned patterning process of the dielectric material layer 110 and the dielectric material layer 130 may be an etching process for removing the portions of the of the dielectric material layer 110 and the dielectric material layer 130 which are uncovered by the patterned photoresist layer PR4 until portions of the semiconductor substrate 100 are revealed. After performing the patterning process, the patterned photoresist layer PR4 is removed from the dielectric material layer 130. In some other embodiments, the patterning process for removing portions of the dielectric material layer 110 and the dielectric material layer 130 is omitted.

Figure 10:
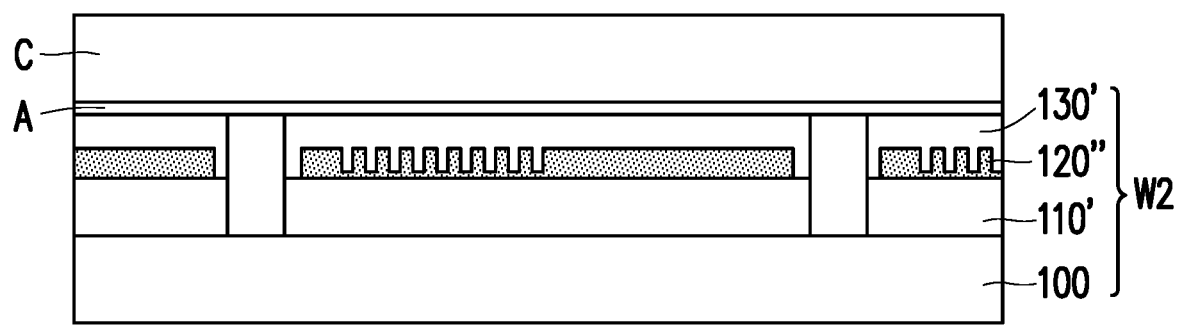

Referring to FIG. 10, a carrier C is provided. An adhesive layer A is formed over the carrier C. The carrier C may a wafer form glass carrier, and the adhesive layer A may be a Light Transfer Heat Conversion (LTHC) layer adhered with a surface of the carrier C. The semiconductor wafer W2 including the semiconductor substrate 100, the bottom dielectric layer 110', the semiconductor patterns 120" and the dielectric material layer 130 is temporarily bonded with the carrier C through the adhesive layer A. After the semiconductor wafer W2 is temporarily bonded with the carrier C, the dielectric material layer 130 are in contact with and adhered with the adhesive layer A. In other words, the carrier C and the semiconductor wafer W2 are located at opposite sides of the adhesive layer A, respectively.

Figure 11:
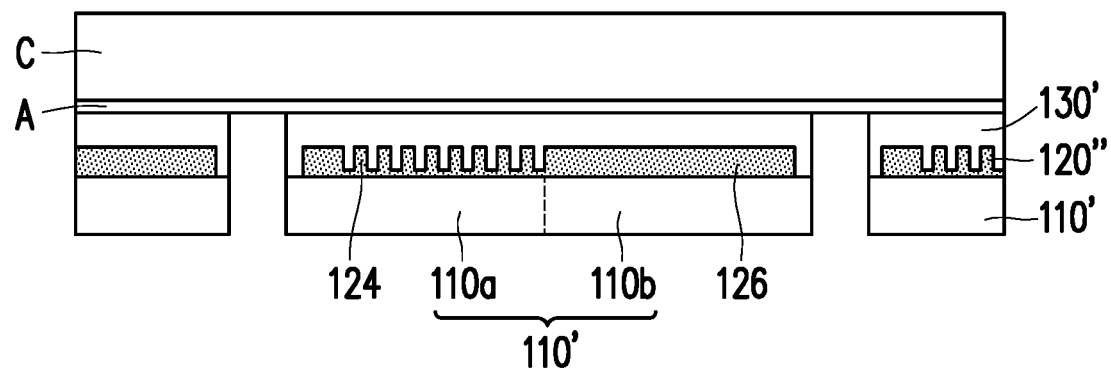

Referring to FIG. 10 and FIG. 11, after the semiconductor wafer W2 is temporarily bonded with the carrier C through the adhesive layer A, the semiconductor substrate 100 is removed from the bottom dielectric layer 110' such that an upper portion of a semiconductor structure is temporarily carried by the carrier C, and a bottom surface of the bottom dielectric layer 110' is revealed. The upper portion of a semiconductor structure may include the bottom dielectric layer 110', the semiconductor patterns 120" disposed over the bottom dielectric layer 110' and the dielectric material layer 130 covering the semiconductor patterns 120". The upper portion of a semiconductor structure may be a photonic die including the bottom dielectric layer 110', the semiconductor patterns 120" and the dielectric material layer 130. In some embodiments, the semiconductor substrate 100 is removed from the bottom dielectric layer 110' through a laser lift-off process. In some other embodiments, the semiconductor substrate 100 is removed from the bottom dielectric layer 110' through a backside etching process. In some alternative embodiments, the semiconductor substrate 100 is removed from the bottom dielectric layer 110' through a grinding process. Furthermore, the grinding process may include a mechanical grinding process, a chemical mechanical polishing (CMP) process or combinations thereof.

As illustrated in FIG. 11, the bottom dielectric layer 110' includes a first portion 110a and a second portion 110b, wherein the first portion 110a of the bottom dielectric layer 110' is located under the grating coupler 124, and the second portion 110b of the bottom dielectric layer 110' is located under the waveguide 126.

Figure 12:
FIG. 12 through FIG. 14 are cross-sectional views schematically illustrating a process flow for fabricating a lower portion of a semiconductor structure in accordance with some embodiments of the present disclosure.
Figure 13:
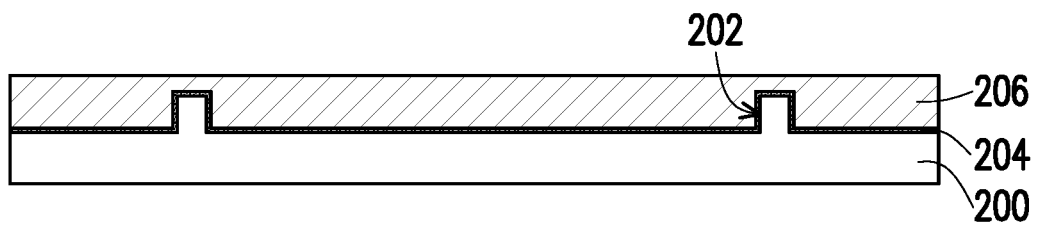
Figure 14:
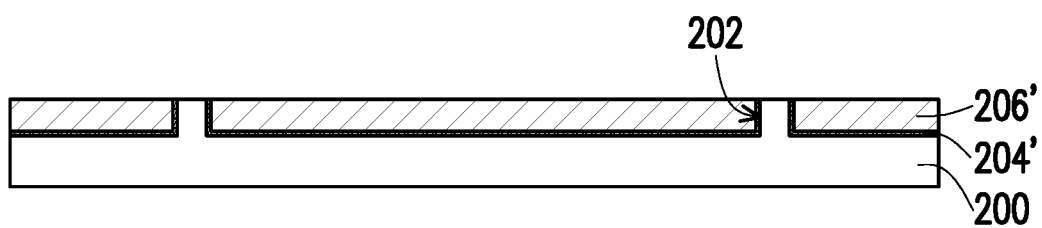

FIG. 12 through FIG. 14 are cross-sectional views schematically illustrating a process flow for fabricating a lower portion of a semiconductor structure in accordance with some embodiments of the present disclosure.

Referring to FIG. 12, a semiconductor substrate 200 is provided. In some embodiments, the semiconductor substrate 200 is a wafer form silicon substrate. A patterned photoresist layer PR5 may be then formed to cover the semiconductor substrate 200. The patterned photoresist layer PR5 may be formed on the semiconductor substrate 200 through a lithography process, and the lithography process may include spin coating of photoresist material, baking of the photoresist material, exposure of the baked photoresist material and development of the exposed photoresist material. A patterning process is performed to remove portions of the semiconductor substrate 200 which are uncovered by the patterned photoresist layer PR5 such that at least one cavity is formed in the semiconductor substrate 200. The above-mentioned patterning process of the semiconductor substrate 200 may be an etching process for removing the portions of the semiconductor substrate 200 which are uncovered by the patterned photoresist layer PR5. After performing the patterning process, the patterned photoresist layer PR5 is removed from the semiconductor substrate 200.

Referring to FIG. 13, a seed layer 204 may be formed over the semiconductor substrate 200. The seed layer 204 may be a titanium/copper (Ti/Cu) layer formed through a sputtering process. The sputtered seed layer 204 may cover the top surface of the semiconductor substrate 200, sidewalls of the at least one cavity 202 and the bottom surface of the at least one cavity 202. A reflective material layer 206 may be formed over the seed layer 204 to fill the at least one cavity 202. The reflective material layer 206 may be a plated copper layer. The maximum thickness of the reflective material layer 206 may be greater than the depth of the at least one cavity 202 such that the top surface of the semiconductor substrate 200 may be entirely covered by the seed layer 204 and the reflective material layer 206. For example, the thickness of the seed layer 204 ranges from about 0.01 micrometers to about 0.5 micrometers, the maximum thickness of the reflective material layer 206 ranges from about 0.01 micrometers to about 10 micrometers, and the depth of the at least one cavity 202 ranges from about 0.1 micrometers to about 100 micrometers.

Referring to FIG. 13 and FIG. 14, after the seed layer 204 and the reflective material layer 206 are formed over the semiconductor substrate 200, a grinding process may be performed to remove portions of the seed layer 204 and the reflective material layer 206 until the top surface of the semiconductor substrate 200 is revealed. After performing the grinding process, at least one seed layer 204' and at least one optical reflective layer 206' are formed in the at least one cavity 202, and the top surface of the at least one optical reflective layer 206' may be substantially leveled with the top surface of the semiconductor substrate 200.

FIG. 15 through FIG. 18 are cross-sectional views schematically illustrating a process flow for bonding the upper and lower portions of the semiconductor structure in accordance with some embodiments of the present disclosure.

Figure 15:
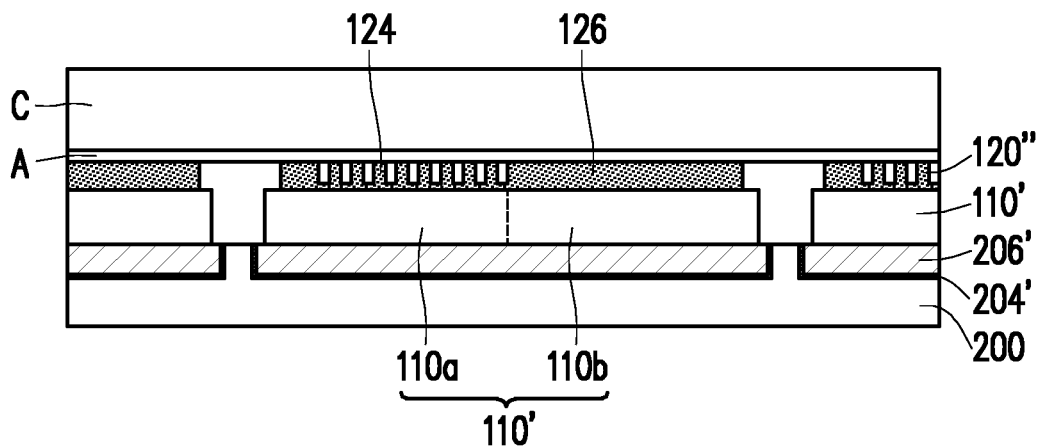
FIG. 15 through FIG. 18 are cross-sectional views schematically illustrating a process flow for bonding the upper and lower portions of the semiconductor structure in accordance with some embodiments of the present disclosure.

Referring to FIG. 15, the upper portion of the semiconductor structure illustrated in FIG. 11 is disposed over and bonded with the lower portion of the semiconductor structure illustrated in FIG. 14. In some embodiments, the upper portion of the semiconductor structure is bonded with the lower portion of the semiconductor structure through a fusion bonding process. In other words, the bottom surface of the bottom dielectric layer 110' may be bonded with the optical reflective layer 206' through a wafer-to-wafer fusion bonding process. The bonding temperature of the wafer-to-wafer fusion bonding process may range from about 200 Celsius degree to about 600 Celsius degree. After the upper portion and the lower portion of a semiconductor structure are bonded, the first portion 110a of the bottom dielectric layer 110' is located between the grating coupler 124 and the at least one optical reflective layer 206', and the second portion 110b of the bottom dielectric layer 110' is located between the waveguide 126 and the at least one optical reflective layer 206'.

Figure 16:
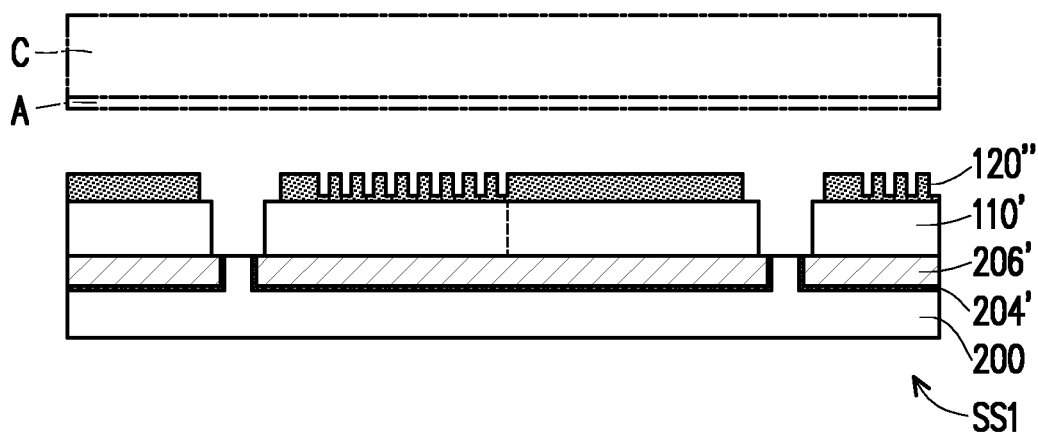

Referring to FIG. 15 and FIG. 16, a de-bonding process of the carrier C and the adhesive layer A is performed. The carrier C and the adhesive layer A may be de-bonded from the semiconductor patterns 120" through a thermal process. After performing the thermal process, the adhesive layer A is heated and the adhesion thereof may decrease such that the carrier C and the adhesive layer A may de-bond from the semiconductor patterns 120". After the carrier C and the adhesive layer A are de-bonded from the semiconductor patterns 120", a wafer form semiconductor structure SS1 is fabricated.

Figure 17:
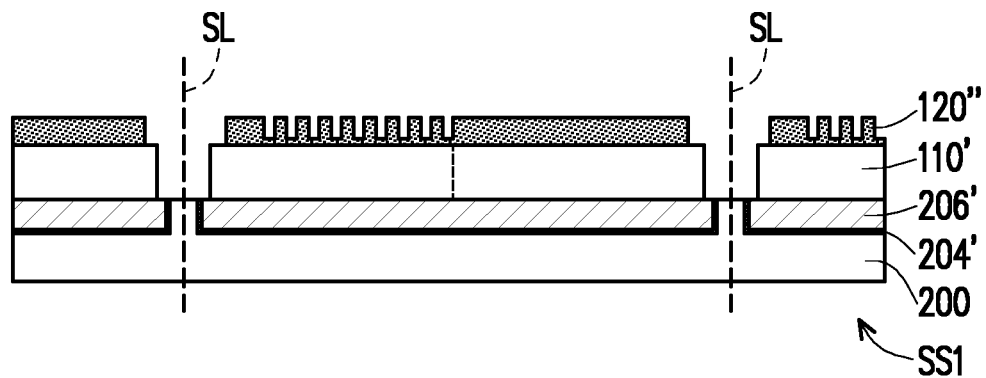
Figure 18:
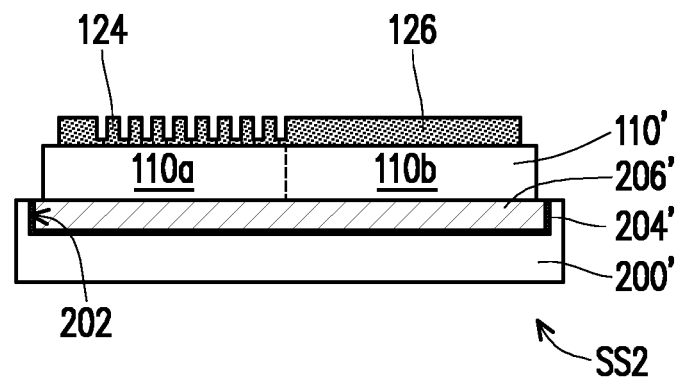

Referring to FIG. 17 through FIG. 19, the wafer form semiconductor structure SS1 is singulated along scribe lines SL to obtain singulated semiconductor structures SS2. Each of the singulated semiconductor structures SS2 includes a semiconductor substrate 200', a bottom dielectric layer 110', a semiconductor pattern 120". The semiconductor substrate 200' includes an optical reflective layer 206'. The bottom dielectric layer 110' is disposed on the semiconductor substrate 200' and covers a portion of the optical reflective layer 206'. The semiconductor pattern 120" may include a base portion 122 disposed on a portion of the bottom dielectric layer 110', a grating coupler 124 disposed on the base portion 122 and a waveguide 126 disposed on the base portion 122, wherein the grating coupler 124 and the waveguide 126 are located over the optical reflective layer 206". In some embodiments, the semiconductor substrate 200' includes a cavity 202, and the optical reflective layer 206' fills the cavity 202. In some embodiments, a top surface of the optical reflective layer 206' is substantially leveled with a top surface of the semiconductor substrate 200'. In some embodiments, the optical reflective layer 206' is partially revealed by the bottom dielectric layer 110'. In some embodiments, the bottom dielectric layer 110' includes a first portion 110a and a second portion 110b, the first portion 110a of the bottom dielectric layer 110' is located between the grating coupler 124 and the optical reflective layer 206', and the second portion 110b of the bottom dielectric layer 110' is located between the waveguide 126 and the optical reflective layer 206'. In some embodiments, the singulated semiconductor structure SS2 further includes a seed layer 204' disposed between the semiconductor substrate 200' and the optical reflective layer 206'.

Figure 20:
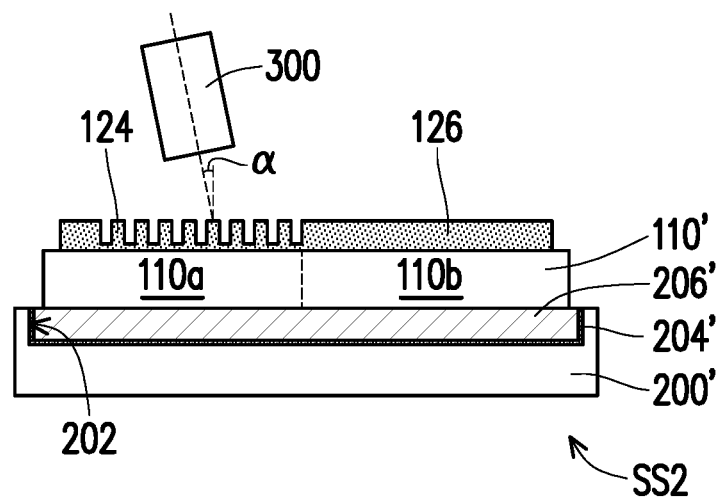
FIG. 20 is a cross-sectional view schematically illustrating an assembly including an optical fiber and the semiconductor structure in accordance with some embodiments of the present disclosure.

FIG. 20 is a cross-sectional view schematically illustrating an assembly including an optical fiber and the semiconductor structure in accordance with some embodiments of the present disclosure.

Referring to FIG. 20, the semiconductor structure SS2 may be optically coupled to and optically operated with an optical fiber 300 for transmission of optical signal. In an embodiment where the semiconductor structure SS2 includes the optical reflective layer 206', the coupling efficiency of the grating coupler 124 in the semiconductor structure SS2 is about 74.4% when optical signal is input via an incident angle α of about 12 degree. In an condition where no optical reflective layer is included in the semiconductor structure, the coupling efficiency of the grating coupler in the semiconductor structure is about 73.8% when optical signal is input via an incident angle α of about 12 degree. Accordingly, the coupling efficiency of the grating coupler 124 in the semiconductor structure SS2 is enhanced by the optical reflective layer 206'.

Figure 21:
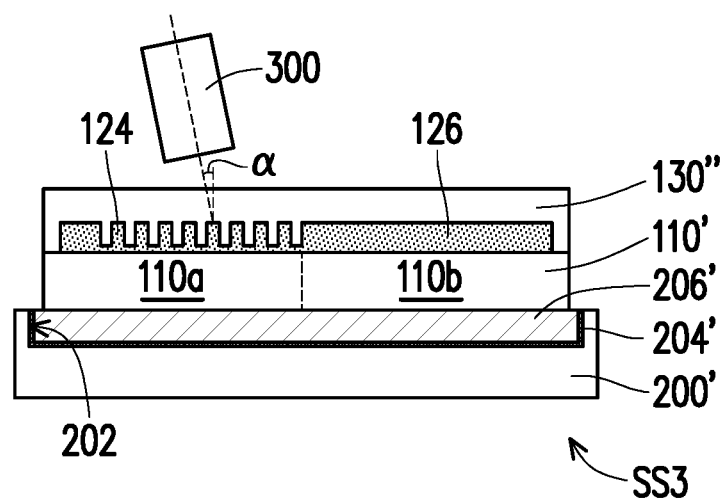
FIG. 21 is a cross-sectional view schematically illustrating an assembly including an optical fiber and the semiconductor structure in accordance with some alternative embodiments of the present disclosure.

FIG. 21 is a cross-sectional view schematically illustrating an assembly including an optical fiber and the semiconductor structure in accordance with some alternative embodiments of the present disclosure.

Referring to FIG. 20 and FIG. 21, the singulated semiconductor structures SS3 illustrated in FIG. 21 is similar with the singulated semiconductor structures SS2 illustrated in FIG. 20 except the singulated semiconductor structures SS3 further includes a top dielectric layer 130" covering the grating coupler 124 and the waveguide 126.

The singulated semiconductor structures SS3 includes a semiconductor substrate 200', a bottom dielectric layer 110', a semiconductor pattern 120" and a top dielectric layer 130". The semiconductor substrate 200' includes an optical reflective layer 206'. The bottom dielectric layer 110' is disposed on the semiconductor substrate 200' and covers a portion of the optical reflective layer 206'. The semiconductor pattern 120" may include a base portion 122 disposed on a portion of the bottom dielectric layer 110', a grating coupler 124 disposed on the base portion 122 and a waveguide 126 disposed on the base portion 122, wherein the grating coupler 124 and the waveguide 126 are located over the optical reflective layer 206". In some embodiments, the semiconductor substrate 200' includes a cavity 202, and the optical reflective layer 206' fills the cavity 202. In some embodiments, a top surface of the optical reflective layer 206' is substantially leveled with a top surface of the semiconductor substrate 200'. In some embodiments, the optical reflective layer 206' is partially revealed by the bottom dielectric layer 110'. In some embodiments, the bottom dielectric layer 110' includes a first portion 110a and a second portion 110b, the first portion 110a of the bottom dielectric layer 110' is located between the grating coupler 124 and the optical reflective layer 206', and the second portion 110b of the bottom dielectric layer 110' is located between the waveguide 126 and the optical reflective layer 206'. In some embodiments, the singulated semiconductor structure SS3 further includes a seed layer 204' disposed between the semiconductor substrate 200' and the optical reflective layer 206'.

In accordance with some embodiments of the disclosure, a semiconductor structure including a semiconductor substrate, a first patterned dielectric layer, a grating coupler and a waveguide is provided. The semiconductor substrate includes an optical reflective layer. The first patterned dielectric layer is disposed on the semiconductor substrate and covers a portion of the optical reflective layer. The grating coupler and the waveguide are disposed on the first patterned dielectric layer, wherein the grating coupler and the waveguide are located over the optical reflective layer. In some embodiments, the semiconductor substrate includes a cavity, and the optical reflective layer fills the cavity. In some embodiments, a top surface of the optical reflective layer is substantially leveled with a top surface of the semiconductor substrate. In some embodiments, the optical reflective layer is partially revealed by the first patterned dielectric layer. In some embodiments, the first patterned dielectric layer includes a first portion and a second portion, the first portion of the first patterned dielectric layer is located between the grating coupler and the optical reflective layer, and the second portion of the first patterned dielectric layer is located between the waveguide and the optical reflective layer. In some embodiments, the semiconductor structure further includes a seed layer disposed between the semiconductor substrate and the optical reflective layer. In some embodiments, the semiconductor structure further includes a second patterned dielectric layer covering the grating coupler and the waveguide.

In accordance with some other embodiments of the disclosure, a semiconductor structure including a semiconductor substrate, a bottom dielectric layer, a semiconductor pattern and a top dielectric layer is provided. The semiconductor substrate includes an optical reflective layer embedded therein. The bottom dielectric layer is disposed on the semiconductor substrate and covers the optical reflective layer. The semiconductor pattern includes a base portion disposed on a portion of the bottom dielectric layer, a grating coupler disposed on the base portion and a waveguide disposed on the base portion, wherein the grating coupler and the waveguide are located over the optical reflective layer. The top dielectric layer covers the semiconductor pattern. In some embodiments, the optical reflective layer includes a reflective surface substantially leveled with a surface of the semiconductor substrate. In some embodiments, the waveguide includes a tapering shaped wave guide. In some embodiments, the semiconductor substrate includes a silicon substrate, and the semiconductor pattern includes a silicon layer. In some embodiments, the semiconductor structure of further includes a seed layer disposed between the semiconductor substrate and the optical reflective layer.

In accordance with some other embodiments of the disclosure, a method including the followings is provided. A grating coupler and a waveguide are formed over a top surface of a dielectric layer. A semiconductor substrate including an optical reflective layer is provided. A bottom surface of the dielectric layer is bonded with the semiconductor substrate and the optical reflective layer such that the grating coupler and the waveguide are located over the optical reflective layer. In some embodiments, forming the grating coupler and the waveguide on the top surface of the dielectric layer includes providing a semiconductor wafer including a substrate, a dielectric layer disposed on the substrate and a semiconductor layer disposed on the dielectric layer; and patterning the semiconductor layer to form a semiconductor pattern on the top surface of the dielectric layer, wherein the semiconductor pattern includes the grating coupler and the waveguide. In some embodiments, forming the grating coupler and the waveguide on the top surface of the dielectric layer further includes bonding the semiconductor pattern with a carrier; and removing the substrate from the dielectric layer and the semiconductor pattern. In some embodiments, the semiconductor pattern is bonded with the carrier through an adhesive layer. In some embodiments, patterning the semiconductor layer to form the semiconductor pattern on the top surface of the dielectric layer includes performing a lithography process followed by at least one etching process such that a base portion of the semiconductor pattern, the grating coupler disposed on the base portion and the waveguide disposed on the base portion are formed. In some embodiments, the dielectric layer is patterned through a lithography process followed by an etching process until portions of the substrate are revealed. In some embodiments, providing the semiconductor substrate comprising the optical reflective layer includes forming a cavity in the semiconductor substrate; and forming the optical reflective layer in the cavity of the semiconductor substrate. In some embodiments, the bottom surface of the dielectric layer is bonded with the semiconductor substrate and the optical reflective layer through a fusion bonding process.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   forming a grating coupler and a waveguide over a top surface of a dielectric layer;
   providing a semiconductor substrate comprising an optical reflective layer; and
   after forming the grating coupler and the waveguide over the top surface of the dielectric layer, bonding a bottom surface of the dielectric layer with the semiconductor substrate and the optical reflective layer such that the grating coupler and the waveguide are located over the optical reflective layer.

2. The method of claim 1, wherein forming the grating coupler and the waveguide on the top surface of the dielectric layer comprises:
   providing a semiconductor wafer comprising a substrate, a dielectric layer disposed on the substrate and a semiconductor layer disposed on the dielectric layer; and
   patterning the semiconductor layer to form a semiconductor pattern on the top surface of the dielectric layer, wherein the semiconductor pattern comprises the grating coupler and the waveguide.

3. The method of claim 2, wherein forming the grating coupler and the waveguide on the top surface of the dielectric layer further comprising:
   bonding the semiconductor pattern with a carrier; and
   removing the substrate from the dielectric layer and the semiconductor pattern.

4. The method of claim 3, wherein the semiconductor pattern is bonded with the carrier through an adhesive layer.

5. The method of claim 2, wherein patterning the semiconductor layer to form the semiconductor pattern on the top surface of the dielectric layer comprises:
   performing a lithography process followed by at least one etching process such that a base portion of the semiconductor pattern, the grating coupler disposed on the base portion and the waveguide disposed on the base portion are formed.

6. The method of claim 2, wherein the dielectric layer is patterned through a lithography process followed by an etching process until portions of the substrate are revealed.

7. The method of claim 1, wherein providing the semiconductor substrate comprising the optical reflective layer comprises:
    forming a cavity in the semiconductor substrate; and
    forming the optical reflective layer in the cavity of the semiconductor substrate.

8. The method of claim 1, wherein the bottom surface of the dielectric layer is bonded with the optical reflective layer through a fission bonding process.

9. A method, comprising:
    providing forming a dielectric layer carried by a first substrate;
    forming a grating coupler and a waveguide over a first surface of the dielectric layer;
    patterning the dielectric layer until the first substrate is revealed;
    removing the first substrate from a second surface of the dielectric layer, the second surface of the dielectric layer being opposite to the first surface of the dielectric layer;
    providing a second substrate comprising an optical reflective layer; and
    bonding the second surface of the dielectric layer with the second substrate and the optical reflective layer such that the grating coupler and the waveguide are located over the optical reflective layer.

10. The method of claim 9, wherein forming the grating coupler and the waveguide over the first surface of the dielectric layer comprises:
    forming a semiconductor layer on the first surface of the dielectric layer; and
    patterning the semiconductor layer to form the grating coupler and the waveguide.

11. The method of claim 10 further comprising:
    before removing the first substrate from the second surface of the dielectric layer, bonding the grating coupler and the waveguide with a carrier through an adhesive layer.

12. The method of claim 10, wherein forming the grating coupler and the waveguide over the first surface of the dielectric layer comprises:
    forming a semiconductor layer on the first surface of the dielectric layer; and
    patterning the semiconductor layer to form a semiconductor pattern comprising a base portion, the grating coupler disposed on the base portion and the waveguide disposed on the base portion.

13. The method of claim 9, wherein providing the second substrate comprising the optical reflective layer comprises:
    forming a cavity in the second substrate; and
    forming the optical reflective layer in the cavity of the second substrate.

14. The method of claim 9, wherein the second surface of the dielectric layer is bonded with the optical reflective layer through a fusion bonding process.

15. A method, comprising:
    providing forming a first dielectric layer carried by a first substrate;
    forming a grating coupler and a waveguide over a first surface of the first dielectric layer;
    forming a second dielectric layer covering the gratin coupler, the waveguide and the first surface of the first dielectric layer;
    patterning the first dielectric layer and the second dielectric layer until the first substrate is revealed;
    removing the first substrate from a second surface of the first dielectric layer, the second surface of the first dielectric layer being opposite to the first surface of the first dielectric layer;
    providing a second substrate comprising an optical reflective layer; and
    bonding the second surface of the first dielectric layer with the second substrate and the optical reflective layer such that the grating coupler and the waveguide are located over the optical reflective layer.

16. The method of claim 15, wherein forming the grating coupler and the waveguide over the first surface of the first dielectric layer comprises:
    forming a semiconductor layer on the first surface of the first dielectric layer; and
    patterning the semiconductor layer to form the grating coupler and the waveguide.

17. The method of claim 16 further comprising:
    before removing the first substrate from the second surface of the first dielectric layer, bonding the second dielectric layer with a carrier through an adhesive layer.

18. The method of claim 16, wherein forming the grating coupler and the waveguide over the first surface of the first dielectric layer comprises:
    forming a semiconductor layer on the first surface of the first dielectric layer; and
    patterning the semiconductor layer to form a semiconductor pattern comprising a base portion, the grating coupler disposed on the base portion and the waveguide disposed on the base portion.

19. The method of claim 15, wherein providing the second substrate comprising the optical reflective layer comprises:
    forming a cavity in the second substrate; and
    forming the optical reflective layer in the cavity of the second substrate.

20. The method of claim 15, wherein the second surface of the first dielectric layer is bonded with the optical reflective layer through a fusion bonding process.

* * * * *